United States Patent
Lin et al.

(10) Patent No.: US 7,178,114 B2
(45) Date of Patent: **\*Feb. 13, 2007**

(54) SCRIPTED, HIERARCHICAL TEMPLATE-BASED IC PHYSICAL LAYOUT SYSTEM

(75) Inventors: Chia-Chi Lin, Hsinchu (TW); Ju-Chian Wang, Hsinchu (TW); Min-Wen Chang, Hsinchu (TW)

(73) Assignee: SpringSoft, Inc., Hsinchu (TW)

( * ) Notice: Subject to any disclaimer, the term of this patent is extended or adjusted under 35 U.S.C. 154(b) by 339 days.

This patent is subject to a terminal disclaimer.

(21) Appl. No.: 10/863,122

(22) Filed: Jun. 7, 2004

(65) Prior Publication Data

US 2004/0225986 A1 Nov. 11, 2004

Related U.S. Application Data

(63) Continuation-in-part of application No. 10/160,690, filed on May 31, 2002, now Pat. No. 6,920,620.

(51) Int. Cl.
*G06F 17/50* (2006.01)
(52) U.S. Cl. ............... 716/3; 716/4; 716/10; 716/11
(58) Field of Classification Search ............... 716/3, 716/4, 8, 10, 11, 19
See application file for complete search history.

(56) References Cited

U.S. PATENT DOCUMENTS

| | | | |
|---|---|---|---|
| 5,620,916 A * | 4/1997 | Eden et al. .................. 716/10 |
| 5,625,568 A * | 4/1997 | Edwards et al. ............... 716/2 |
| 6,064,806 A | 5/2000 | Lakos et al. .................. 716/11 |
| 6,341,366 B1 | 1/2002 | Wang et al. .................. 716/11 |
| 6,457,163 B1 | 9/2002 | Yang ............................. 716/8 |
| 6,480,995 B1 | 11/2002 | Schmidt et al. .............. 716/11 |
| 6,523,162 B1 | 2/2003 | Agrawal et al. .............. 716/19 |
| 2004/0054659 A1* | 3/2004 | McIntyre ....................... 703/3 |

* cited by examiner

*Primary Examiner*—Sun James Lin
(74) *Attorney, Agent, or Firm*—Daniel J. Bedell; Smith-Hill and Bedell

(57) ABSTRACT

A computer-aided design tool for automatically generating a layout for an electronic device to be formed by a set of objects implemented within an integrated circuit, receives input from a user defining a device template specifying shapes, dimensions and relative positions within the layout of the objects forming the device. Some of the object dimensions and/or relative positions are specified as functions of values of input parameters to be supplied by the user. When the user supplies the input parameters, the CAD tool evaluates the functions to determine the object dimensions and/or positions that are functions of the input parameters and then generates a layout for the electronic device wherein object shapes, dimensions and relative positions are as specified in the device template and consistent with the function evaluations. The device template may also include instructions for modifying the layout, for example, indicating that copies of an object are to form an array in the layout, that copies of one object are to fill another object, that an object is to be added to the layout having a shape that is a Boolean function of other objects, and that objects are to be added to or removed from the layout.

21 Claims, 8 Drawing Sheets

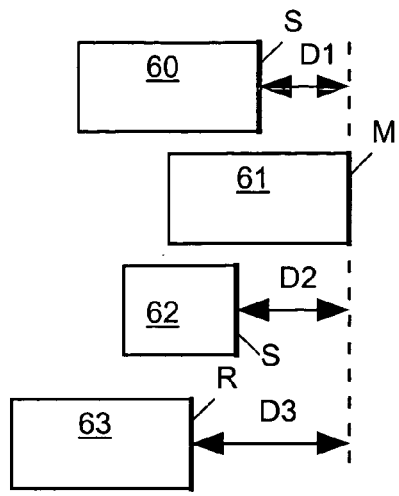
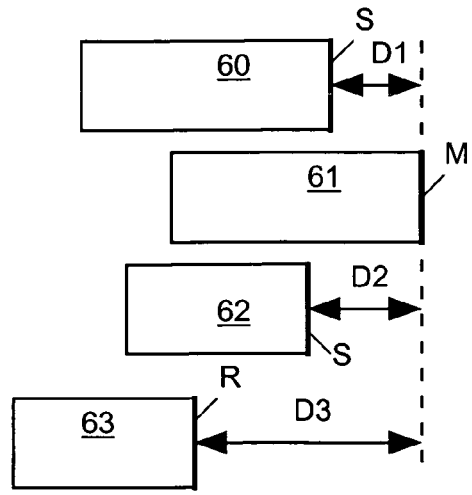
FIG. 15　　　　　　　FIG. 16
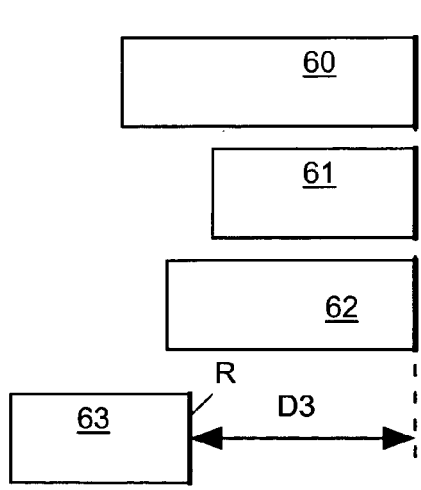
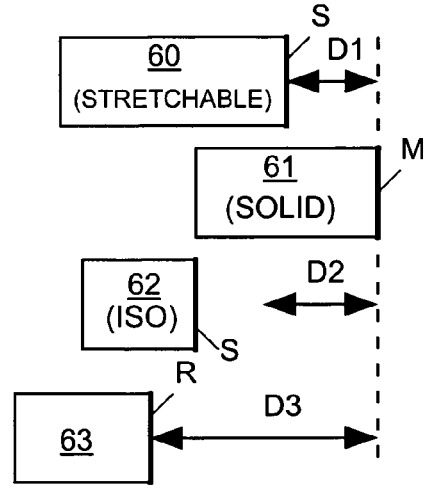
FIG. 17　　　　　　　FIG. 18
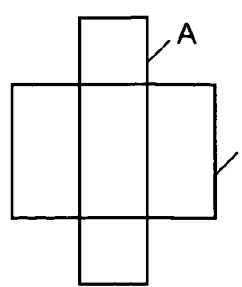
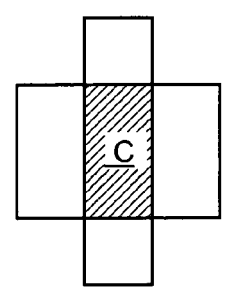
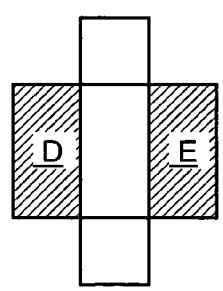
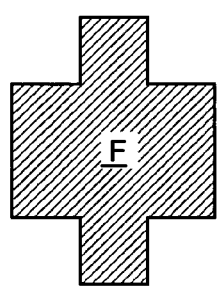
FIG. 19　FIG. 20　FIG. 21　FIG. 22

SCRIPTED, HIERARCHICAL TEMPLATE-BASED IC PHYSICAL LAYOUT SYSTEM

CROSS-REFERENCE TO RELATED APPLICATIONS

This application is a continuation-in-part of U.S. patent application Ser. No. 10/160,690 filed May 31, 2002 now U.S. Pat. No. 6,920,620.

BACKGROUND OF THE INVENTION

1. Field of the Invention

The invention relates in general to a computer-aided design tool for helping an integrated circuit (IC) designer generate layouts for circuit devices implemented within an IC, and in particular to a method for producing layouts based on a scripted, hierarchical template specifying dimensions and relative positions of objects in a layout as functions of input parameters.

2. Description of Related Art

An IC designer typically uses computer-aided design tools to generate layouts for transistors, gates and many other types of electronic devices incorporated into an integrated circuit. For example FIG. 1 is a simplified sectional elevation view of an nMOS transistor 10 including a semiconductor substrate 11 having a p-doped well area 12 and n-doped source and drain areas 14 and 16, an insulating layer 18, a gate conductor 20, a source conductor 22, a drain conductor 24 and some polysilicon contacts 26. A layout for transistor 10 specifies the shapes and positions of the various areas or structures on each layer of the transistor. Computer-aided design (CAD) tools typically provide a graphic interface allowing the designer to draw each area or structure, and to treat it as a graphic object having an easily modifiable size, shape and position. For example FIG. 2 is a simplified plan view of a layout for transistor 10 of FIG. 1 that a designer might create using a conventional IC device layout CAD tool. FIG. 2 depicts the objects residing on the various layers of the transistor as superimposed, and although not shown in FIG. 2, the objects residing on each layer are usually depicted by separate colors.

IC fabricators impose various design rules on the layout of devices that can be implemented within an IC, placing limitations of the dimensions and spacing of objects residing on the various layers of an IC. For example for the transistors 10 of FIG. 2, design rules may place limitations on the width or length of the channel area between areas 14 and 16 and limitations on the amount by which well area 12 must overlap source and drain areas 14 and 16. The design rules vary with the type of semiconductor technology the fabricator employs.

Rather than directly designing every device included in an IC, a designer will, whenever possible, copy the layouts of standard devices (cells) included in a cell library, typically provided by the IC fabricator. When an IC fabricator develops a new IC technology, the fabricator establishes new design rules for that technology, and creates a new cell library providing cell layouts that are consistent with the new design rules. An IC designer developing a cell library will therefore have to design layouts for a large number cells, and that can be an expensive and time-consuming process. It is possible for the designer to save some time by creating the new cell library at least in part by modifying the layouts of cells of an existing cell library for some other IC technology so that the cells conform to new design rules. However, when a designer modifies a position or a dimension of any one object in a layout, he or she will often have to modify many other objects in the layout to avoid design rule violations or to otherwise maintain the proper spatial relationships between objects forming the device. Thus, for example, if a designer wants to decrease the width of gate 20 of transistor 10 of FIG. 2, the designer will have to also change the positions or dimensions of many of the other objects forming transistor 10 in a manner consistent with the new design rules.

Many cells included in a cell library will have somewhat similar topologies. For example, FIG. 3 shows an IC layout for a transistor 30 similar to transistor 10 of FIG. 3 but having a larger gate width. To create the layout for transistor 30, the designer could copy the layout for transistor 10, modify the dimensions of various objects included in the copy to accommodate the increased gate width and then add an extra set of contacts. FIG. 4 shows a "folded" transistor 40 that is similar to transistor 10 of FIG. 2 except that it has two gates 20 and two source areas 14, and it is possible for a designer to create the layout for transistor 40 by modifying the layout of transistor 10. However, while it may save some time to copy and then modify the layout of transistor 10 to produce the layouts of transistors 30 and 40, the designer may still require a substantial amount of time to determine whether and how to modify every object in the new transistor layouts.

What is needed is a method for a layout CAD tool enabling a designer to quickly and easily generate layouts for many topologically related devices without having to manually adjust numbers, positions or dimensions of objects in any of the generated layouts and having to carefully check each layout to ensure it satisfies design rules.

BRIEF SUMMARY OF THE INVENTION

The invention relates to method for a computer-aided design (CAD) tool enabling a user to generate layouts for electronic devices incorporated into integrated circuits (ICs). The invention is suitably implemented in the form of software residing on computer-readable media which when read and executed by a conventional computer causes the computer to generate electronic device layouts in response to user input.

In accordance with the invention, a user initially develops a "device template" for an electronic device layout including a description of the shapes, dimensions and positions on various IC layers of the objects that are to form an electronic device within an IC. Objects may include, for example, doping areas in the semiconductor substrate, and material shapes to be fabricated on the various conductive and insulating layers above the substrate. The device template may describe some of the dimensions and positions of the objects as variables having values defined by functions ("edge constraints") of user-supplied input parameters. The device template also includes a script, a set of one or more instructions ("operators") for modifying a device layout in response to the user input parameters. For example an operator may indicate an object is to be copied to create an array of objects in the layout or to fill one object with an array of other objects, or may indicate an object is to be added or deleted from the layout under specified conditions which may be functions of the user input parameters. Thereafter, when the user supplies values for the input parameters, the CAD tool automatically generates a layout wherein dimensions and positions of objects included in the layout are consistent with the edge constraints and values of the user-supplied input parameters and then executes the script to modify the layout as indicated by the operators included in the script.

The invention enables the user, after having created the device template, quickly and easily to command the CAD tool to generate layouts for a large number of "topologically related" devices simply by specifying parameter values for each layout. Devices are "topologically related" when the type, number, dimensions and positions of the objects forming each device can be expressed by the same set of functions (edge constraints and operators) of a set of parameters. Thus any differences in layouts of topologically related devices are due only to differences in the user-supplied input parameter values.

It is accordingly an object of the invention to provide a method for a layout CAD tool enabling a designer to quickly and easily generate layouts for many topologically related devices without having to manually adjust numbers, positions or dimensions of objects in any of the generated layouts.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

BRIEF DESCRIPTION OF THE DRAWINGS

FIGS. 15–18 are simplified plan views of example device layouts.

FIG. 19 is a simplified plan view of two objects in a device layout:

FIGS. 20–22 are simplified plan views of the two objects of the device layout of FIG. 19 showing shaded areas representing various Boolean combinations of the two objects.

DETAILED DESCRIPTION OF THE INVENTION

The invention relates to method for a computer-aided design (CAD) tool enabling a user to generate layouts for electronic devices incorporated into integrated circuits (ICs). The invention is suitably implemented in the form of software residing on computer-readable media which when read and executed by a conventional computer causes the computer to automatically generate electronic device layouts in response to user input. Suitable computer-readable media for storing the software include, but are not limited to, compact disks, floppy disks, hard disks, and random access or read only memory. While the specification describes at least one exemplary embodiment of the invention considered a best mode of practicing the invention, those of skill in the art will appreciate that the invention need not be limited to the particular example(s) described below or to the manner in which they operate.

An electronic device such as a transistor or a logic gate implemented within an IC includes structures formed on several semiconductor, insulating and conductive material layers of the IC. A CAD tool in accordance with the invention generates a layout for such a device describing each structure as a two-dimensional object having a particular shape and a position within a horizontal plane of a particular one of an IC's layers. The CAD tool allows a user to create a "device template" specifying object shapes, positions and numbers as functions of user-supplied input parameters and then automatically creates a layout based on the device template whenever the user supplies specific values for the input parameters. Thus once the user has developed a device template for a particular type of device, the user can quickly and easily command the CAD tool to generate layouts for a large number of "topologically related" devices simply by providing the CAD tool with suitable parameter values for each layout.

Figure 1:
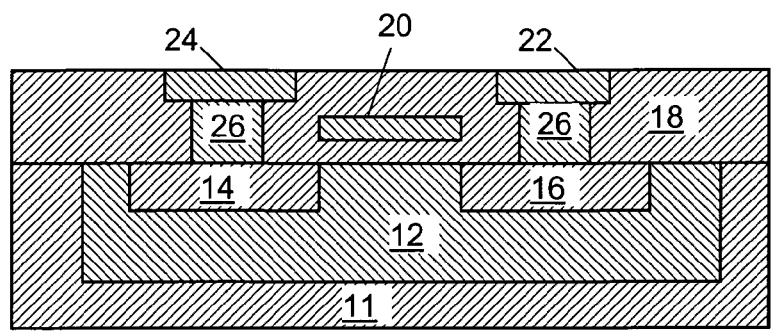
FIG. 1 is a simplified sectional elevation view of a prior art transistor.
Figure 2:
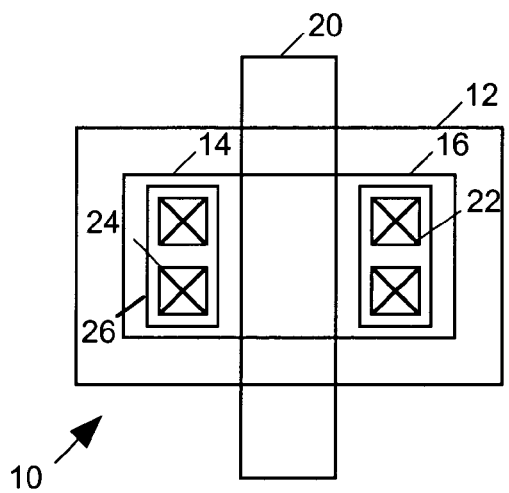
FIGS. 2–4 are simplified plan views of prior art transistor layouts.
Figure 3:
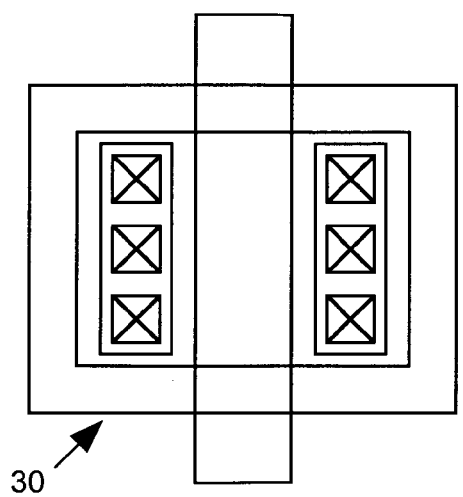
Figure 4:
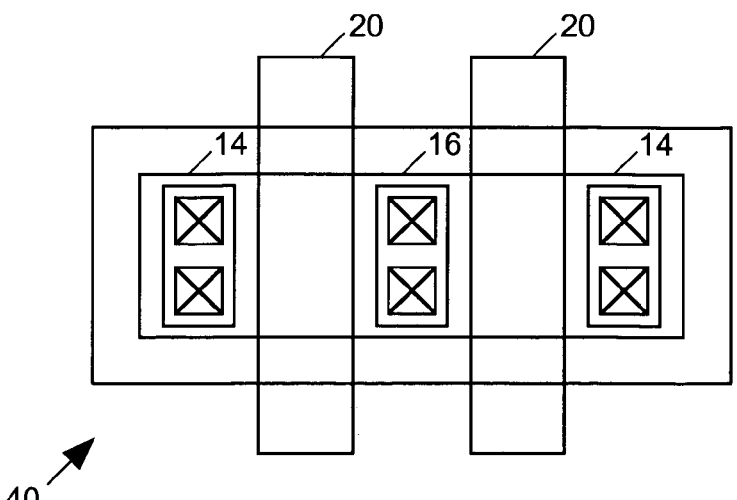

A set of devices are "topologically related" when the number, dimensions and positions of objects forming each device of the set can be defined as functions of the same set of parameters. For example, the three transistors FIGS. 2–4 are topologically related even though they may have differing numbers of objects and objects of differing dimensions because, as shall be discussed below, it is possible to define each of those layouts as functions of the same set of parameters. The differences between the transistor layouts of FIGS. 2–4 are due only to differences in values of those parameters.

Figure 5:
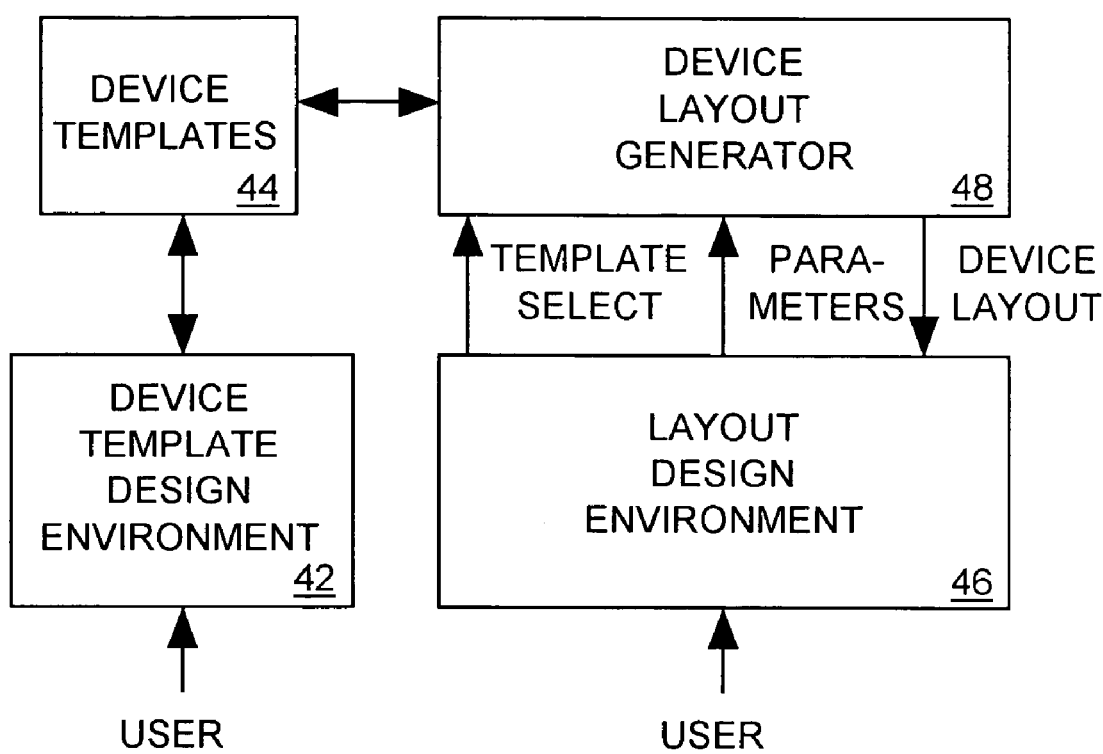
FIG. 5 is a process flow diagram illustrating a method in accordance with the invention for designing IC device layouts.

FIG. 5 is a data flow diagram illustrating an exemplary embodiment of a method in accordance with the invention. The CAD tool provides a device template design environment 42 enabling a user to create a set of device templates 44, each describing a device layout wherein the number, dimensions and positions of objects forming each device of the set are defined as functions of the set of parameters. The CAD tool also includes a layout design environment 46 enabling a user to create and modify IC layouts. When the user wishes to incorporate a device having a layout described by one of device templates 44 into the IC being design, the user supplies input parameters to layout design environment 46 indicating the position of the device within the layout, the name of the particular device template 44 of interest, and values of the parameters employed by the device template. Layout design environment 46 then invokes a device layout generator 48, which obtains the indicated device template 44 from computer memory and generates a device layout specified by the device template that is consistent with the user-supplied parameter values. Layout design environment 46 then places the generated device layout at the indicated position with the IC layout.

Device Template

As mentioned above, each device template 44 describes the layout of a device as a function of input parameters. For example to create a device template 44 capable of describing the layout of each of the transistors of FIGS. 2–4, the user first uses device template design environment 42 to create the template layout of FIG. 6A consisting of three overlapping rectangles the user has labeled G, OD and PP. Template design environment 42 employs a graphical user interface enabling the user to draw the template layout on a computer screen in a manner generally similar to that employed by conventional layout CAD tools. However template design environment 42 also allows the user to assign variable names, in this example EU, ED, ER, EL, ET, EB, AW1, AW2, GW and GL, to various dimensions of the layout that are to be functions of user-supplied input parameters. For example, GW and GL represent the width and length of the transistor's gate and AW1 and AW2 represent the widths of the transistor's drain and source areas. The user will also employ template design environment 42 to create a layout as illustrated in FIG. 6B for one of the contacts formed over the drain and sink areas. The dimensions of the contact of FIG. 6B could be functions of input parameters, but in this particular example, the dimensions of the contact of FIG. 6B are constants so it is not necessary for the designer to assign variables to contact dimensions.

Using template design environment 42, the designer also defines the set of input parameters and includes within the device template a set of procedures and functions ("edge constraints") defining values of the dimension variables as functions of the input parameters. Relative to the device template having the master layout of 6A, the user could define the following input parameters:

$GateWidth—the desired sum of gate width of all gate areas $WellOdEnc—the desired values of ET, EL, ER and EB $PolyWellExt—the desired values of EU and ED $ActiveWidth—the desired drain and sink widths The user could also provide the following two procedures for deriving other relevant parameter values from the input parameter values:

GateCnt($GateWidth)=INT($GateWidth/20)+
1IndividualGateWidth($GateWidth)=
$GateWidth/GateCnt($GateWidth)

The GateCnt($GateWidth) procedure returns the number of gate areas the transistor will require as a function of $GateWidth width. In this example, the number of gate area is chosen to limit the width of any one gate to 20 units. The IndividualGateWidth($GateWidth) returns the width of each gate as the ratio of $GateWidth to the number of gates.

The user also provides a set of edge constraints defining the variable dimensions as functions of the input and/or derived parameter values as follows:

GW=IndividualGateWidth($GateWidth)

ET=$WellOdEnc

ER=$WellOdEnc

EU=$PolyWellExt

AW1=$ActiveWidth

AW2=$ActiveWidth+GateCnt($GateWidth)−1)*
($ActiveWidth+$GL)

EL=$WellOdEnc

EB=$WellOdEnc

ED=$PolyWellExt

Figure 6A:
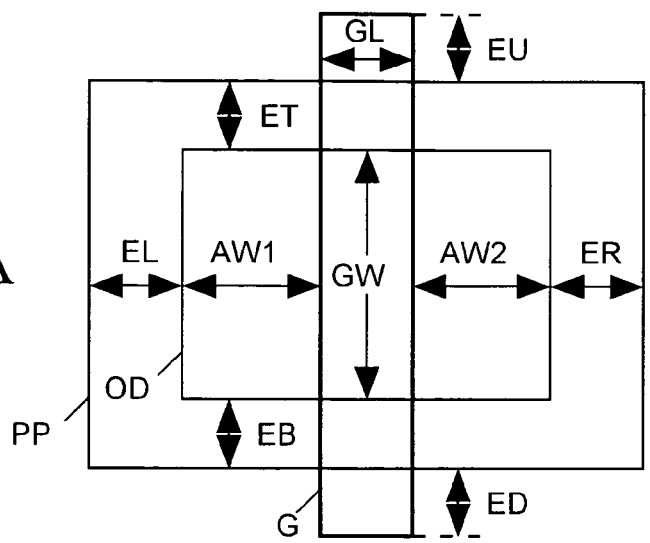
FIGS. 6A and 6B are plan views of graphical portions of an example device template employed by the method of FIG. 5.
Figure 6B:
Figure 7:
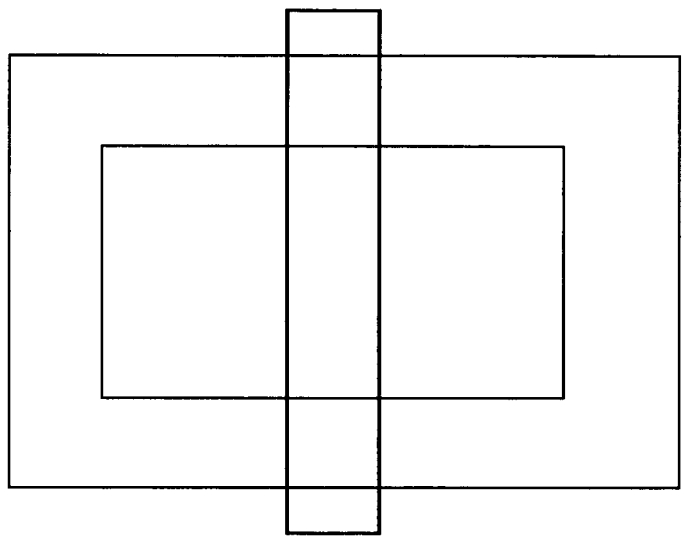
FIGS. 7–12 are simplified plan views of successive stages of an example device layout produced in accordance with the device template of FIGS. 6A and 6B.

The user now provides a set of "operators" that will instruct device layout generator 48 of FIG. 5 how to modify the template layout of FIG. 6A in response to the user input parameters to produce a transistor layout. When generating a device layout, device layout generator 48 will initially draw the layout as depicted in FIG. 7 with dimensions consistent with the edge constraints based on the user-assigned parameter values. Device layout generator 48 will then sequentially execute each of the operators included in the device template, with each operating causing the layout generator to modify the layout in some way. The first operator could be as follows:

GS=Copy(G, XYcount, XYpitch, Condition)

The Copy operator tells the device layout generator to generate an array GS of one or more copies of the gate rectangle G. The Copy operator is executed if its Condition argument, a Boolean that may be a function of user input parameter values, is true. In this example, Condition is set to a constant true to indicate that the Fill operation is executed unconditionally. The XYcount and XYpitch arguments of the copy function indicate the dimensions and pitch of the array in the X and Y directions of the plane of the layer in which they are created. The device template will define the XYcount argument as a function of the gate count and will define the XYpitch argument as a function AW1. When the device is to have two gates, the device layout generator will respond to the COPY operator by modifying the layout of FIG. 7 to produce the layout of FIG. 8.

Note that the device layout generator automatically adjusts dimensions of existing objects as necessary to ensure that the device layout continues to satisfy the edge constraints. The next operator in the device template could be as follows:

MD=NOT(OD,GS)

Figure 8:
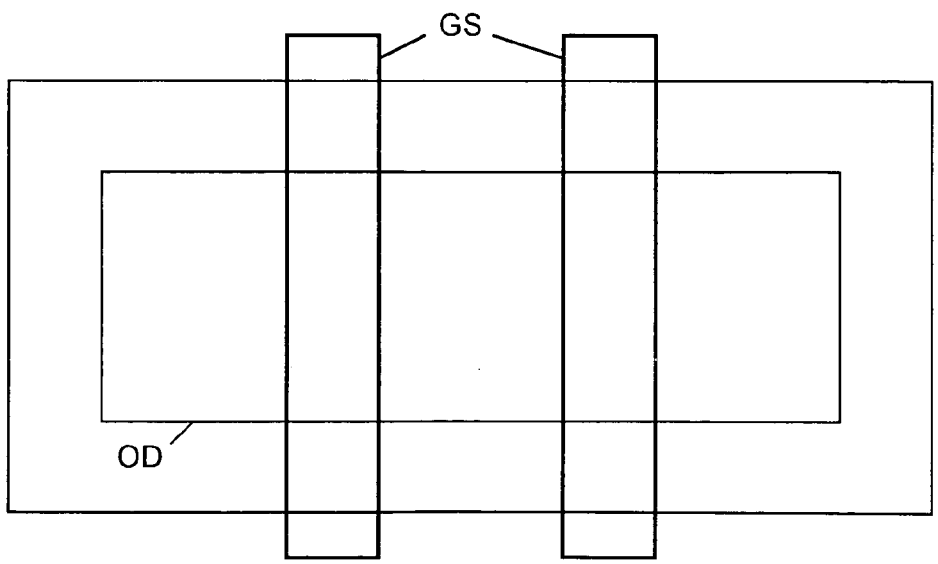
Figure 9:
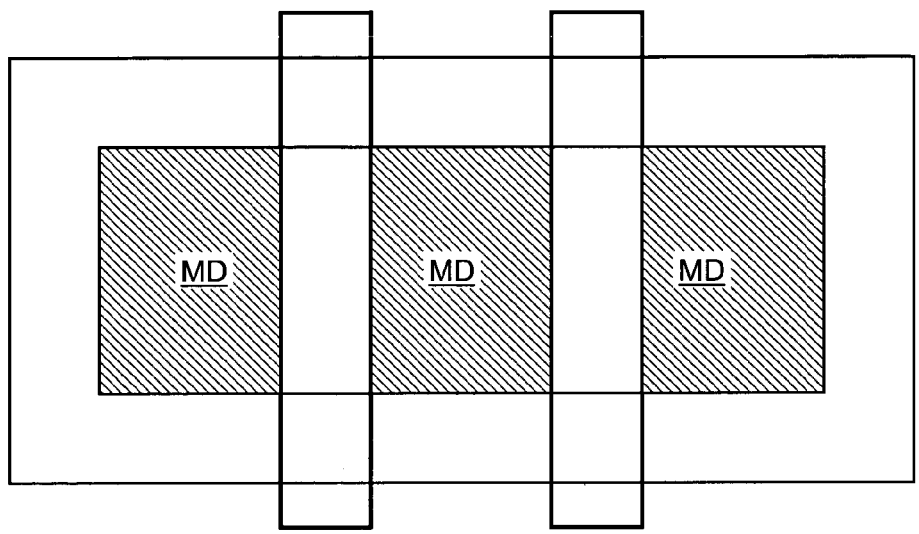

The NOT operator defines an object MD to be included in the layout as the portions of rectangle OD that do not overlap gate array GS as illustrated by the shaded areas of FIG. 8. The next operator of the device template may be as follows:

CONT=FILL(MD, Contact, XYpitch, Condition)

Figure 10:
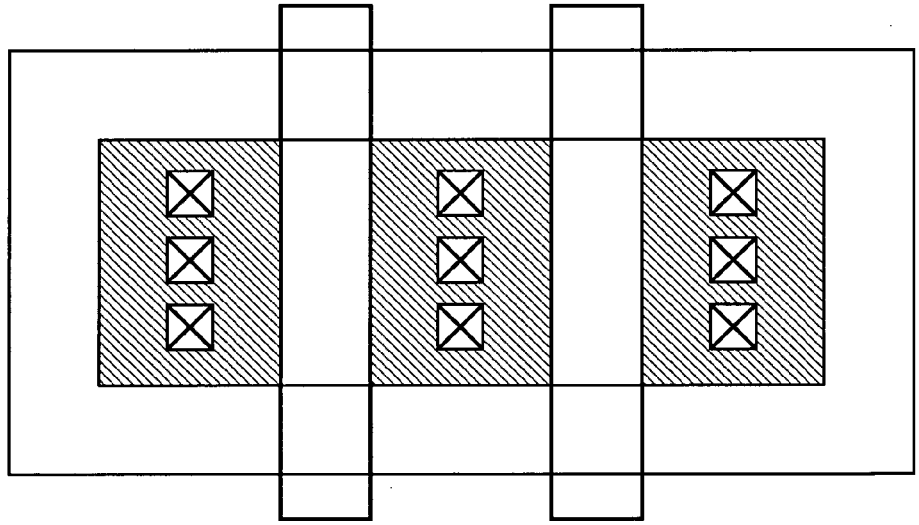

The FILL operator to generate an object called "CONT" by filling each MD area with an array of objects called "Contact", each of which is identical to the contact object illustrated in FIG. 6B, with a pitch (spacing between fill objects) in the X and Y directions determined by the XY pitch argument, when the Condition argument is true. The Fill operator is executed if its Condition argument, a Boolean that may be a function of user input parameter values, is true. In this example, Condition is set to a constant true to indicate that the Fill operation is executed unconditionally. In this example, the FILL operator tells device layout generator 48 to fill each MD area as shown in FIG. 10 with an array of contacts of the type illustrated in FIG. 6B. The XYpitch argument may define pitch as a fixed distance between contacts but alternatively may be defined as a function of a user-defined input parameter. The next operator may be as follows:

REMOVE(MD, Condition)

Figure 11:
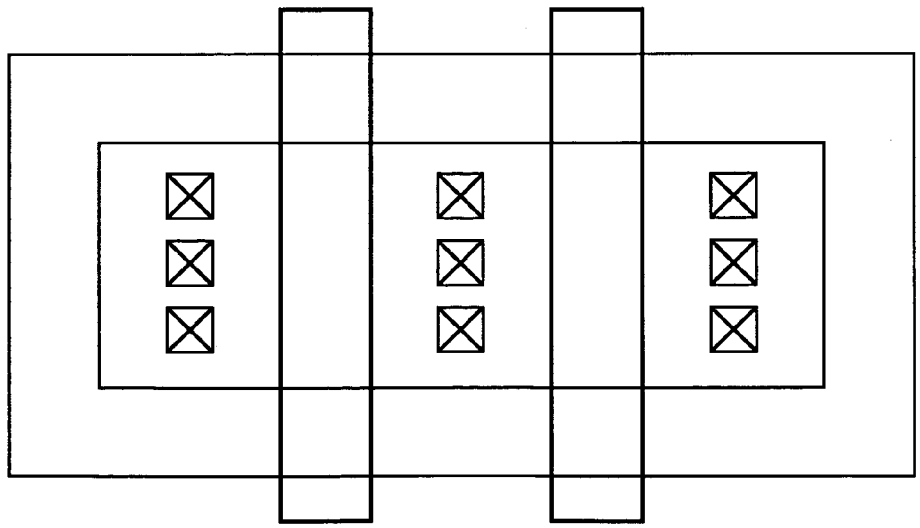

The REMOVE operator tells device layout generator 48 to remove the MD objects from the layout as shown in FIG. 11. The Remove operator is executed if the Condition argument, a Boolean that may be a function of user input parameter values, is true. However, in this example Condition is set to a constant true to indicate that the Remove operation is executed unconditionally. The last operator of the device template may be as follows:

*MET*1=SIZE(CONT, Metal1Layer, Overhang, Condition)

Figure 12:
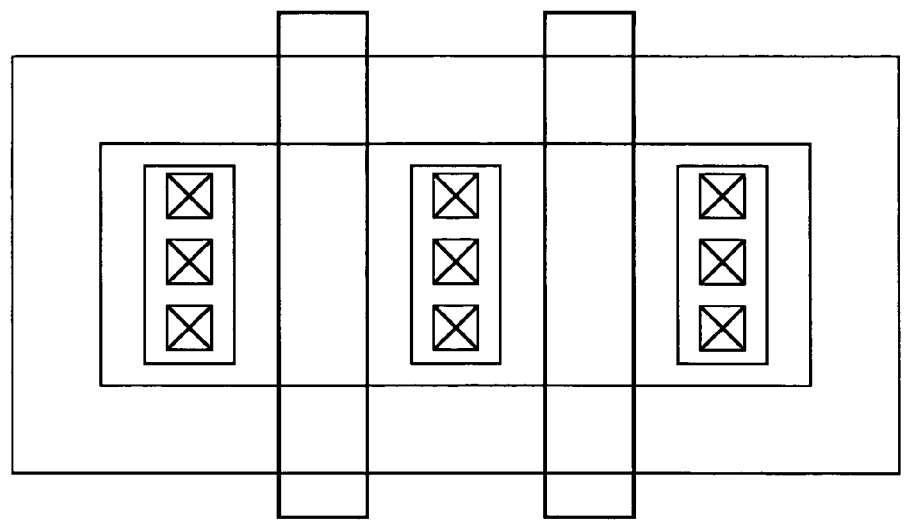

The SIZE operator tells device layout generator 48 to generate an object on a layer called "Metal1Layer" positioned as illustrated in FIG. 12, to surround each of the CONT arrays with an overlap defined by the Overhang argument which may be defined as a constant or as a function of user input data. The Size operator is executed if its Condition argument, a Boolean that may be a function of user input parameter values, is true. In this example, Condition is set to a constant true to indicate that the Size operation is executed unconditionally.

Edge Constraints

As illustrated above, device layout generator 48 of FIG. 5 may change or reposition various objects in a layout described by a device template when generating a device layout in order to satisfy various user-defined edge constraints that are functions of user-supplied input parameter values. Each object in a layout has an "object adjustment attribute" that tells the device layout generator 48 of FIG. 5 how and whether it may adjust an object's shape or position to satisfy an edge constraints. An object may have any of three attributes, "stretchable", "solid" and "isolated". When an object is "stretchable", the device layout generator can satisfy an edge constraint by changing the object's dimensions, by moving one of its edges. When the device template designates an object as "solid", the device layout generator moves the object to satisfy an edge constraint but it does not change the object's shape. When an object is defined as being "isolated" the device layout can neither move nor change the shape of the object to satisfy an edge constraint. Thus, the device layout generator does not attempt to satisfy an edge constraint when doing so would necessitate a change to an isolated object's shape or position, however the device layout generator would notify the user of a constraint conflict.

A "distance" edge constraint, as discussed above, specifies a distance between two edges that the device layout generator 48 is to maintain.

Figure 13:
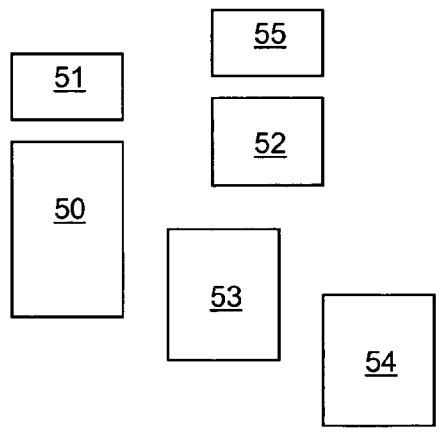
FIG. 13 is a simplified plan view of a device layout.
Figure 14:
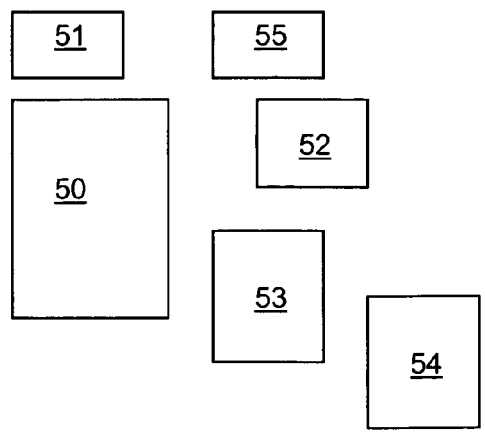
FIG. 14 is a simplified plan view of the device layout of FIG. 13 after being modified to increase a dimension of one of the objects included in FIG. 13 and to adjust positions of other objects to satisfy an "auto pushing" constraint on the objects.

A template designer may specify a layout to be subject to an "auto-pushing constraint" requiring the device layout generator to automatically move objects in an X or Y direction whenever necessary to maintain X or Y direction constraints even when distances between the objects are not subject to a distance constraints. For example when the device layout generator 48 alters object 50 in the layout of FIG. 13 to increase its dimensions as illustrated in FIG. 14, and the layout is subject to an auto-pushing constraint, then the device layout generator will also move object 51 in the Y direction and move objects 52–54 in the X direction so that they retain the same horizontal spacing relative to object 50. However, the device layout generator would not reposition object 55 because it does not overlap object 50 in either the X or Y direction.

A "group align" constraint placed on a set of "slave edges" requires the device layout generator to provide a specified alignment between those "slave edges" relative to a master active edge. For example, assume edges S of objects 60 and 62 of FIG. 15 are deemed slave edges subject to a group align constraint relative to a master edge M of object 61. Assume also that FIG. 15 is the initial layout depicted in the template with the distance D1 being the fixed distance between edge M and edges S of object 60 and distance D2 being the fixed distance between edges S of objects 60 and 62. Distance D3 can be a variable function of input parameter values. When generating a layout in response to input parameter values setting D3 larger as shown in FIG. 16, the device layout generator must move the slave edges S to the right relative to edge M to provide the appropriate distance D1.

A "separate align" constraint placed on edges of a set of objects is similar to the group align constraint except that every edge can act as a master edge. If the layout generator repositions any edge of the group, it repositions every other edge of the group to maintain the current edge alignment. Thus, if the right edges of objects 60–62 of FIG. 15 were subject to a separate align constraint, the result of moving the right edge of object 61 to the right would appear as in FIG. 17, with right edges of objects 60 and 62 being moved to the same position.

Object Adjustment Attribute

Each object in a layout has an "object adjustment attribute" telling the device layout generator 48 of FIG. 5 whether it may adjust an object's shape or position to satisfy an edge constraint. An object may have any one of three object adjustment attributes, "stretchable", "solid" and "isolated". When an object is "stretchable", the device layout generator can satisfy an edge constraint by changing the object's dimensions, by moving one of its edges. For example, when the device layout generator generated the layout of FIG. 16 based on the template of FIG. 15, it stretched objects 60–62 when it repositioned the rightmost edges to maintain spacing constraints D1 and D2 when it changed spacing D3. Objects 60–62 had the "stretchable" object adjustment attribute. When the device template designates an object as "solid", the device layout generator can reposition the entire object to satisfy an edge constraint but it cannot change the object's shape. When an object is defined as being "isolated" the device layout can neither move nor change the shape of the object to satisfy an edge constraint. Thus, the device layout generator does not attempt to satisfy an edge constraint when doing so would necessitate a change to an isolated object's shape or position, but would, however, notify the user of a constraint conflict should it detect one. For example, referring to FIG. 15, if object 60 is stretchable, object 61 is solid, and object 62 is isolated, then in attempting to satisfy the group alignment constraint on their edges, the device layout generator would stretch object 60 and reposition object 61 as shown in FIG. 18 to satisfy the alignment constraint, but it could neither stretch nor move object 62 to satisfy the alignment constraint. The layout generator would therefore notify the user of a specification conflict that prevents it from satisfying the group alignment constraint with respect to spacing D2.

Operators

The following are examples of operators to which device layout generator 48 can respond. However, those of skill in the art will appreciate that layout generator 48 could be designed to respond to other types of operators.

AND(A,B), NOT(A,B), OR(A,B)

Given objects A and B, for example as in FIG. 19, the AND operator tells the device layout generator to place an object C as in FIG. 20 in the layout defined by an area of overlap of objects A and B. The NOT operator tells the device layout generator to place in the layout objects having areas D and E within object B that do not overlap object A. The OR operator tells the device layout generator to place in the layout an object defined by the area F covering areas occupied by either one or both of objects A and B REMOVE(A, Condition)

The REMOVE operator tells device layout generator 48 to remove an object from a layout when the Condition argument, a Boolean that may be a function of user input data, is true.

SIZE(Object, Layer, Overhang, Condition)

The SIZE operator tells device layout generator 48 to add an object identified on a layer identified by the Layer argument, positioned to surround the object existing object defined by the Object argument with an overhang defined by the Overhang argument when the Condition argument, a Boolean that may be a function of user input data, is true. The Overhang argument may be a constant or a function of user input data. For example, the SIZE operator can tell device layout generator 48 to generate an object on a layer called "Metal1Layer" positioned as illustrated in FIG. 12, to surround each of the CONT arrays with an overlap defined by the Overhang argument.

COPY(Object, XYsize, XYpitch, Condition)

Figure 23:
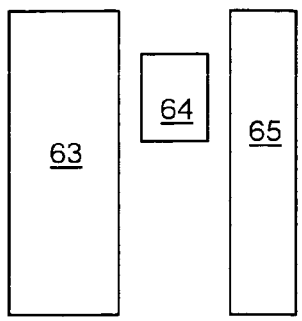
FIGS. 23 and 24 are simplified plan views of a device layout before and after execution of an example copy operator.

The Copy operator tells the device layout generator to generate an array of one or more copies of an object identified by its Object argument if the Condition argument is true. The XYsize and XYpitch arguments of the copy function indicate the dimensions and pitch array, which may be constants or functions of input parameters. For example, given the layout of FIG. 23 including three objects 63, 64 and 63, a COPY(Object64,(3,2), (2,4), True) operator tells the device layout generator to modify the layout of FIG. 23 to replace object 64 with a 3×2 array of similar objects as illustrated in FIG. 4. Note that the device layout generator has executed an auto-push operation to reposition object 65 to maintain spacing from the object array.

FILL (FillArea, FillObject, XYpitch, Offset, Condition)

Figures 25, 26:
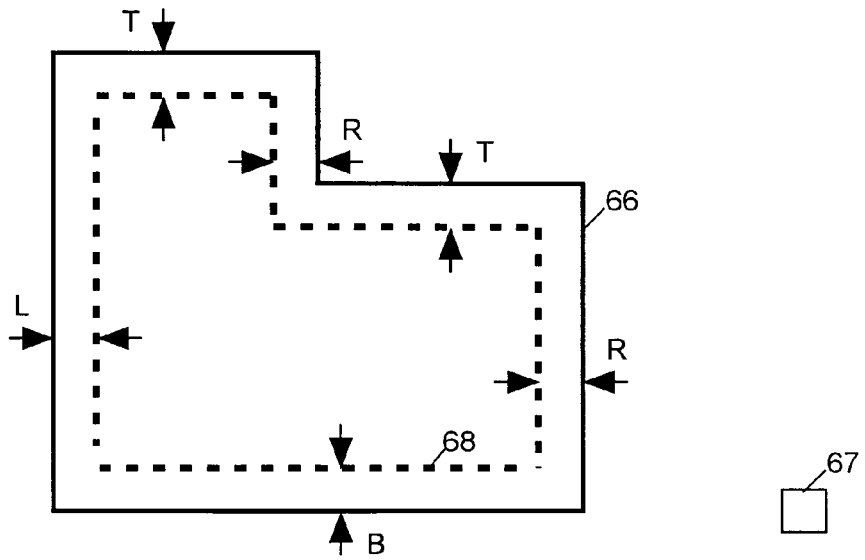
FIGS. 25 and 26 are simplified plan view of objects described by a device template.
Figure 27:
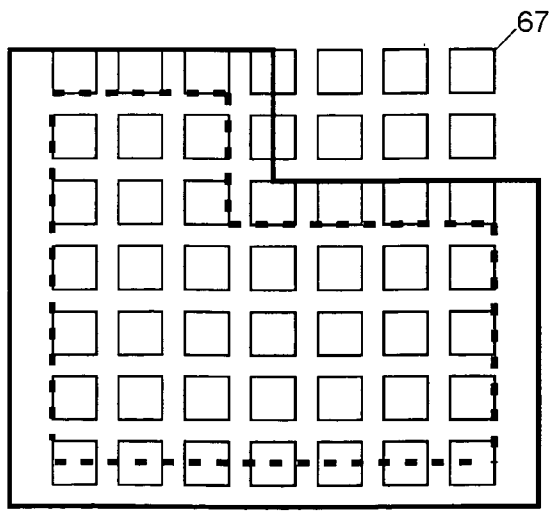
FIGS. 27 and 28 show stages of a layout I which the object of FIG. 25 is filled with copies of objects of FIG. 26.
Figure 28:
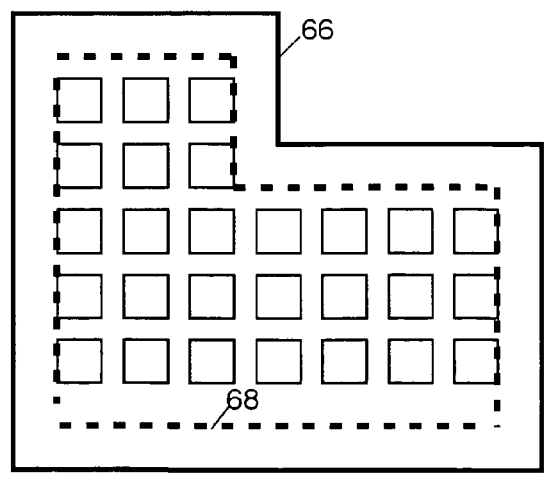

The Copy operator tells the device layout generator to generate an array of copies of an object identified by its FillObject argument within an area encompassed by an object identified by the FillArea argument with an offset indicated by the Offset argument when the Condition argument is true. The XYpitch argument indicates the X and Y direction pitch of the array. For example, FIG. 25 illustrates an object 66 identified by FillArea to be filled with an array of objects 67 identified by the FillObject as depicted in FIG. 26. The Offset argument indicates the top (T), right (R), left (L) and bottom (B) offset of boundaries of an area 68 within area D to be filled. The device layout generator executes the Fill command by first generating the array of objects 67 in the layout as illustrated in FIG. 27 and then deleting any copies of object 67 not residing wholly within area F as illustrated in FIG. 28.

Hierarchical Device Template

The example above shows how a user can develop a device template for a single transistor, a relatively simple device. In accordance with one aspect of the invention, the CAD tool allows a user to describe more complicated devices hierarchically when developing a device template.

Figure 24:
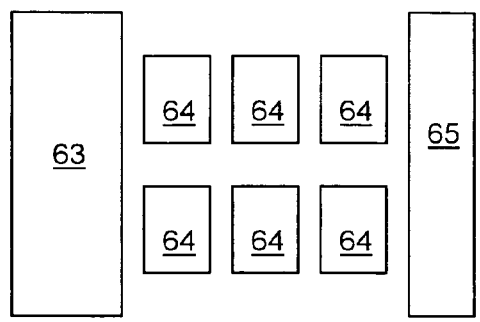
Figure 29:
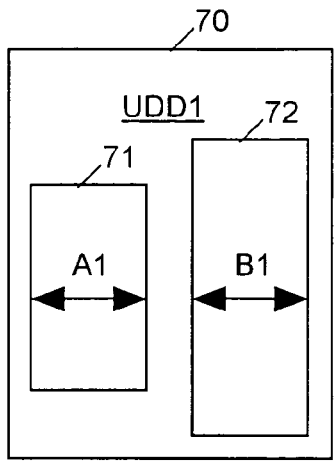
FIGS. 29–31 are plan views of graphic portions of successive levels of an example hierarchical device template in accordance with the invention.
Figure 30:
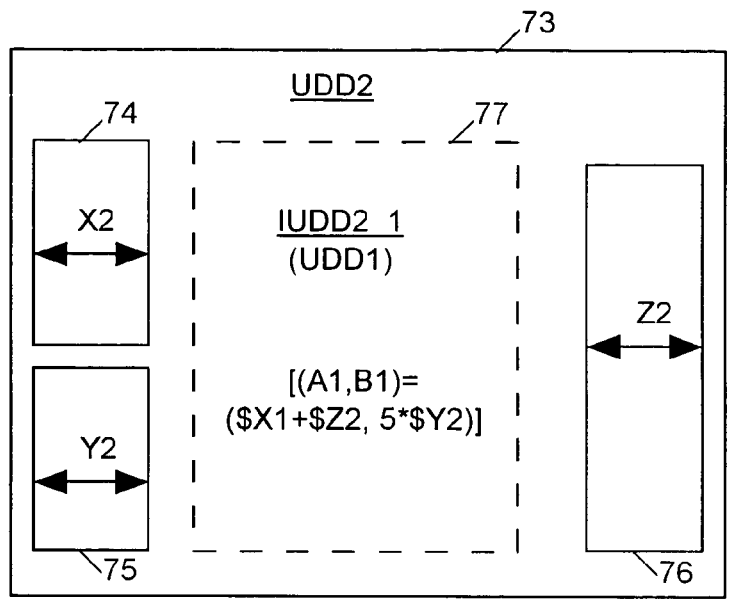
Figure 31:
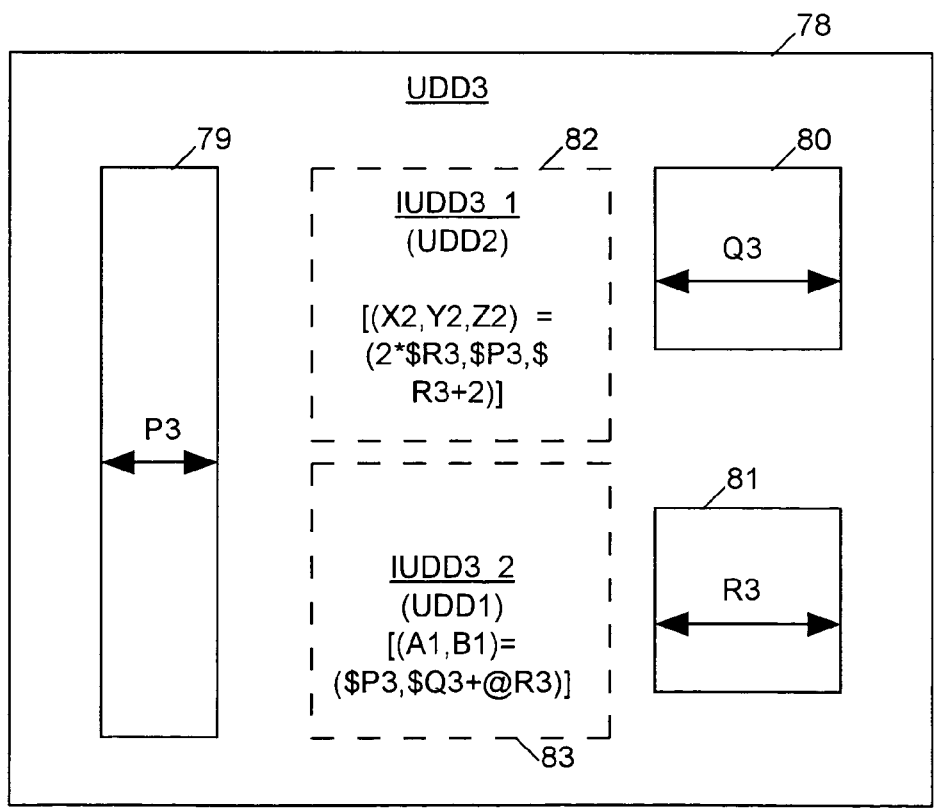

FIGS. 29–31 represent the three levels of an example hierarchal device template. FIG. 29 illustrates a first level of the hierarchy, a device UDD1 having three objects 70–72 wherein objects 71 and 72 have variable widths A1 and B1. FIG. 29 represents the second level of the hierarchy, a device UDD2 including five objects 73–77, wherein objects 74–76 have variable dimensions X2–Z2 and object 77 is a copy of UDD1 of FIG. 21 labeled IUDD2_1. At the UDD2 level of the hierarchal design, the user has configured the device template to define dimensions A1 and B1 of UDD2_1 as functions of dimensions X2, Y2 and Z2. FIG. 30 represents the third level of the hierarchy including six objects 78–83. Objects 79–80 have variable dimensions P3, Q3 and R3. Object 82 is a copy of UDD2 of FIG. 24 labeled IUDD3_1 wherein dimensions X2, Y2 and Z2 are defined as functions of R3 and P3. Object 83 is another copy of UDD1 of FIG. 23 labeled IUDD3_2 wherein dimensions A1 and B1 are defined as functions of P3, Q3 and R3.

Thus has been described a method for a CAD tool for automatically generating a layout for an electronic device employing a user-defined device template specifying shapes, dimensions and relative positions within the layout of the objects forming the device. As discussed above, the template may define some of the object dimensions and/or relative positions as functions of values of user-supplied input parameters. When the user supplies the input parameters, the CAD tool evaluates the functions to determine the object dimensions and/or positions that are functions of the input parameters and then generates a layout for the electronic device wherein object shapes, dimensions and relative positions are as specified in the device template and consistent with the function evaluations. The device template may also include operators instructing the tool to modify the layout in response to the input parameters, for example indicating that copies of an object are to form an array in the layout, that copies of one object are to fill another object, that an object in the layout is to be a Boolean function of other objects, and that objects are to be added to or removed from the layout depending on values of the input parameters.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for use by a computer-aided design tool for generating a final layout for an electronic device implemented within an integrated circuit (IC), the method comprising the steps of:

a. storing a device template including a master layout specifying dimensions and relative positions of objects within the IC to form the electronic device, wherein some of the object dimensions and relative positions are specified as functions of values of input parameters, and wherein at the device template also includes a script containing instructions for modifying a preliminary layout for the electronic device to produce the final layout, b. receiving the values of the input parameters from a user, c. evaluating the functions relative to the values of the input parameters supplied by the user at step b to determine values of object dimensions and relative positions the device template specifies as functions of the input parameters, d. generating the preliminary layout for the electronic device wherein object dimensions and relative positions specified by the preliminary layout are consistent with those specified in the master layout and with the values of object dimensions and relative positions determined at step c, and e. modifying the preliminary layout in accordance with the script to generate the final layout for the electronic device.

2. The method in accordance with claim 1 further comprising a step of f. generating the device template stored at step a in response to input received from a user describing a set of objects, specifying object dimensions and relative positions within the master layout, identifying the dimensions of the objects that are functions of the input parameters, and defining those functions.

3. The method in accordance with claim 2 wherein the input received from the user describes at least one object of the set of objects as being formed by a collection of other objects having a layout described by an other device template.

4. The method in accordance with claim 1 wherein the script includes a copy instruction indicating that the preliminary layout is to be modified by replicating one of the objects in the preliminary layout.

5. The method in accordance with claim 1 wherein the script includes a fill instruction indicating that the preliminary layout is to be modified by filling one of the objects in the preliminary layout with copies of another object.

6. The method in accordance with claim 1 wherein the script includes an instruction indicating chat the preliminary layout is to be modified by adding an object having a shape that is a Boolean combination of shapes of other objects.

7. The method in accordance with claim 1 wherein the script includes an instruction indicating that the layout is to be modified by removing an object from the preliminary layout.

8. The method in accordance with claim 1 wherein at least one of the instructions indicates chat a particular object is to be added to the layout.

9. Computer-readable media containing software which, when read and executed by a computer, causes the computer to implement a method for automatically generating a layout for an electronic device to be formed by a set of objects implemented within an integrated circuit, wherein the method comprises steps of:

a. storing a device template specifying shapes and dimensions of the set of objects forming the electronic device within the layout, wherein some object dimensions are specified as functions of values of input parameters, b. receiving the values of the input parameters from a user, c. evaluating the functions to determine the object dimensions that are functions of the input parameters, d. processing the device template to generate the layout for the electronic device wherein object shapes and dimensions within the layout are as specified in the device template and wherein the dimensions that are functions of the input parameters are as determined at step c.

10. The computer-readable media in accordance with claim 9 wherein the device template also specifies a distance between edges of two of the objects as another function of the input parameters, and wherein the method further comprise a step of:

e. evaluating said another function to determine said distance, wherein the distance between the edges of the two objects in the layout generated at step d are as determined at step c.

11. The computer-readable media in accordance with claim 10 wherein the method further comprises a step of f. generating the device template stored at step a in response to input received from a user via a graphics interface specifying shapes, dimensions and relative positions within the layout of objects forming the electronic device, and in response to user input identifying the dimensions of the objects that are functions of the input parameters and defining the functions and identifying the distance between the edges of the two objects that is the another function of the input parameters and defining said another function.

12. The computer-readable media in accordance with claim 11 wherein the input received from the user specifying the shapes, dimensions and relative positions within the layout of object forming the device is provided via a graphical user interface wherein the user specifies the shapes, dimension and relative positions by drawing representations of the objects.

13. The computer-readable media in accordance with claim 9 wherein the method further comprises a step of e. generating the device template stored at step a in response to input received from a user specifying shapes, dimensions and relative positions within the layout of objects forming the electronic device, and identifying the dimensions of the objects that are to be functions of the input parameters and defining those functions.

14. The computer-readable media in accordance with claim 13 wherein the input received from the user specifying the shapes, dimensions and relative positions within the layout of objects forming the electronic device is provided via a graphical user interface wherein the user specifies the shapes, dimension and relative positions by drawing representations of the objects.

15. The computer-readable media in accordance with claim 11 wherein the device template is hierarchical in that input received from a user describes some objects forming the device by referencing another device template specifying shapes, dimensions and relative positions of said some objects and by indicating a relative position with the layout of the objects referenced by said another device template.

16. The computer-readable media in accordance with claim 9 wherein the device template also includes instructions for modifying the layout generated at step d, and wherein the method further comprises a step of:

e. modifying the generated layout in accordance with the instructions.

17. The computer-readable media in accordance with claim 16 wherein at least one of the instructions is a copy instruction indicating that the layout is to be modified by replicating one of the objects in the layout.

18. The computer-readable media-readable media in accordance with claim 16 wherein at least one of the instructions is a fill instruction indicating that the layout is to be modified by filling one of the objects with copies of another of the objects.

19. The computer-readable media in accordance with claim 16 wherein at least one of the instructions indicates the layout is to be modified by adding an object having a shape that is a Boolean combination of shapes of two others of the objects.

20. The computer-readable media in accordance with claim 16 wherein at least one of the instructions indicates that the layout is to be modified by removing an object from the layout.

21. The computer-readable media in accordance with claim 16 wherein at least one of the instructions indicates that a particular object is to be added to the layout.

\* \* \* \* \*